United States Patent
Brand et al.

(10) Patent No.: US 9,673,277 B2
(45) Date of Patent: Jun. 6, 2017

(54) METHODS AND APPARATUS FOR FORMING HORIZONTAL GATE ALL AROUND DEVICE STRUCTURES

(71) Applicant: APPLIED MATERIALS, INC., Santa Clara, CA (US)

(72) Inventors: Adam Brand, Palo Alto, CA (US); Bingxi Sun Wood, Cupertino, CA (US); Naomi Yoshida, Sunnyvale, CA (US); Lin Dong, Sunnyvale, CA (US); Shiyu Sun, San Jose, CA (US); Chi-Nung Ni, Foster City, CA (US); Yihwan Kim, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/885,521

(22) Filed: Oct. 16, 2015

(65) Prior Publication Data
US 2016/0111495 A1   Apr. 21, 2016

Related U.S. Application Data

(60) Provisional application No. 62/066,329, filed on Oct. 20, 2014.

(51) Int. Cl.
*H01L 29/06* (2006.01)
*H01L 29/20* (2006.01)
(Continued)

(52) U.S. Cl.
CPC .... *H01L 29/0673* (2013.01); *H01L 21/30612* (2013.01); *H01L 21/76224* (2013.01);
(Continued)

(58) Field of Classification Search
CPC ................. H01L 29/0673; H01L 29/42392
See application file for complete search history.

(56) References Cited

U.S. PATENT DOCUMENTS

| 9,012,284 B2 | 4/2015 | Glass et al. |
| 2005/0112851 A1 | 5/2005 | Lee et al. |

(Continued)

OTHER PUBLICATIONS

International Search Report and Written Opinion mailed Jan. 22, 2016 for PCT Application No. PCT/US2015/056285.
(Continued)

*Primary Examiner* — Yu-Hsi D Sun
(74) *Attorney, Agent, or Firm* — Moser Taboada; Alan Taboada (57) ABSTRACT

A method of forming a semiconductor device includes: forming a superlattice structure atop the top surface of a substrate, wherein the superlattice structure comprises a plurality of first layers and a corresponding plurality of second layers alternatingly arranged in a plurality of stacked pairs; forming a lateral etch stop layer by epitaxial deposition of a material of the first layer or the second layer of the superlattice structure atop a sidewall of the superlattice structure, or by selectively oxidizing edges of the first layers and second layers of the superlattice structure; subsequently forming a source region adjacent a first end of the superlattice structure and a drain region adjacent a second opposing end of the superlattice structure; and selectively etching the superlattice structure to remove each of the first layers or each of the second layers to form a plurality of voids in the superlattice structure.

19 Claims, 6 Drawing Sheets

(51) Int. Cl.
    *H01L 29/66*     (2006.01)
    *H01L 21/762*     (2006.01)
    *H01L 21/306*     (2006.01)

(52) U.S. Cl.
    CPC ........ *H01L 29/20* (2013.01); *H01L 29/66522* (2013.01); *H01L 29/66545* (2013.01); *H01L 29/66795* (2013.01)

(56) References Cited

U.S. PATENT DOCUMENTS

| | | |
|---|---|---|
| 2011/0068407 A1 | 3/2011 | Yeh et al. |
| 2011/0147828 A1 | 6/2011 | Murthy et al. |
| 2014/0087523 A1 | 3/2014 | Basker et al. |
| 2014/0225065 A1* | 8/2014 | Rachmady ........ H01L 29/42392 257/24 |

OTHER PUBLICATIONS

Dupré et al, "3D Nanowire Gate-All-Around Transistors: Specific Integration and Electrical Features", Solid-State Electronics 52 (2008) 519-525.

Bangsaruntip et al., "High Performance and Highly Uniform Gate-All-Around Silicon Nanowire MOSFETs with Wire Size Dependent Scaling", IEEE 2009, pp. 12.3.1-12.3.4.

Gu et al., "First Experimental Demonstration of Gate-All-Around III-V MOSFETs by Top-Down Approach", IEEE 2011, pp. 33.2.1-33.2.4.

* cited by examiner

METHODS AND APPARATUS FOR FORMING HORIZONTAL GATE ALL AROUND DEVICE STRUCTURES

CROSS-REFERENCE TO RELATED APPLICATIONS

This application claims benefit of U.S. provisional patent application Ser. No. 62/066,329, filed Oct. 20, 2014, which is herein incorporated by reference in its entirety.

FIELD

Embodiments of the present disclosure generally relate to semiconductor devices and more particularly to horizontal gate all around device structures and methods and apparatus for forming horizontal gate all around device structures.

BACKGROUND

As the feature sizes of transistor devices continue to shrink to achieve greater circuit density and higher performance, there is a need to improve transistor device structure to improve electrostatic coupling and reduce negative effects such as parasitic capacitance and off-state leakage. Examples of transistor device structures include a planar structure, a fin field effect transistor (FinFET) structure, and a horizontal gate all around (hGAA) structure. The hGAA device structure includes several lattice matched channels suspended in a stacked configuration and connected by source/drain regions. The inventors believe that the hGAA structure provides good electrostatic control and can find broad adoption in complementary metal oxide semiconductor (CMOS) wafer manufacturing.

Accordingly, the inventors have provided improved horizontal gate all around device structures and methods and apparatus for forming horizontal gate all around device structures.

SUMMARY

Horizontal gate all around device structures and methods and apparatus for forming same are provided herein. In some embodiments, a method of forming a semiconductor device includes: forming a superlattice structure atop a top surface of a substrate, wherein the superlattice structure comprises a plurality of first layers and a corresponding plurality of second layers alternatingly arranged in a plurality of stacked pairs; forming a lateral etch stop layer by epitaxial deposition of a material of the first layer or the second layer of the superlattice structure atop a sidewall of the superlattice structure, or by selectively oxidizing edges of the first layers and second layers of the superlattice structure; subsequently forming a source region adjacent a first end of the superlattice structure and a drain region adjacent a second opposing end of the superlattice structure; and selectively etching the superlattice structure to remove each of the first layers or each of the second layers to form a plurality of voids in the superlattice structure.

In some embodiment, a cluster tool for forming a semiconductor device includes: a plurality of processing chambers coupled to a central transfer chamber, wherein the plurality of processing chambers comprise: (a) an etching process chamber and an atomic layer deposition process chamber coupled to the central transfer chamber; (b) an etching process chamber, a cleaning process chamber, and a epitaxial deposition process chamber coupled to the central transfer chamber; or (c) a selective etch process chamber and a chemical vapor deposition chamber or an oxidation chamber.

In some embodiments, a method of forming a semiconductor device includes implanting a dopant into a first location on a substrate; forming a superlattice structure atop a top surface of the substrate, wherein the superlattice structure comprises a plurality of first layers and a corresponding plurality of second layers alternatingly arranged in a plurality of stacked pairs, and wherein the superlattice structure is formed atop the first location; patterning the substrate to form a plurality of field isolation regions in the substrate adjacent to the superlattice structure; filling the field isolation regions with a dielectric material; forming a replacement gate structure over the superlattice structure; forming a sidewall spacer along outer sidewalls of the replacement gate structure; forming a lateral etch stop layer by epitaxial deposition of a material of the first layer or the second layer of the superlattice structure atop a sidewall of the superlattice structure, or by selectively oxidizing edges of the first layers and second layers of the superlattice structure; subsequently forming a source region adjacent a first end of the superlattice structure and a drain region adjacent a second opposing end of the superlattice structure; depositing an inter-layer dielectric layer over the substrate; etching the replacement gate structure to expose a channel region of the superlattice structure prior to selectively etching the superlattice structure; selectively etching the superlattice structure to remove each of the first layers or each of the second layers to form a plurality of voids in the superlattice structure; and depositing a layer to fill the plurality of voids in the superlattice structure, wherein the layer comprises an outer material and an inner material and wherein the outer material is a dielectric material and the inner material is a conductive material.

In some embodiments, a computer readable medium, having instructions stored thereon which, when executed, cause a method of forming a semiconductor device are provided herein. The method may include any of the embodiments disclosed herein.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are not to be considered limiting of scope, for the disclosure may admit to other equally effective embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Improved methods and apparatus for forming horizontal gate all around device structures are provided herein. The method and apparatus described herein advantageously produce a thin body device with improved thickness control, a key to future channel length scaling in CMOS devices. Embodiments of the disclosure herein provide a defect free stacked channel structure which can provide a geometric benefit in the current density per square micrometer of surface area on a wafer, significantly improving circuit density.

Figure 1:
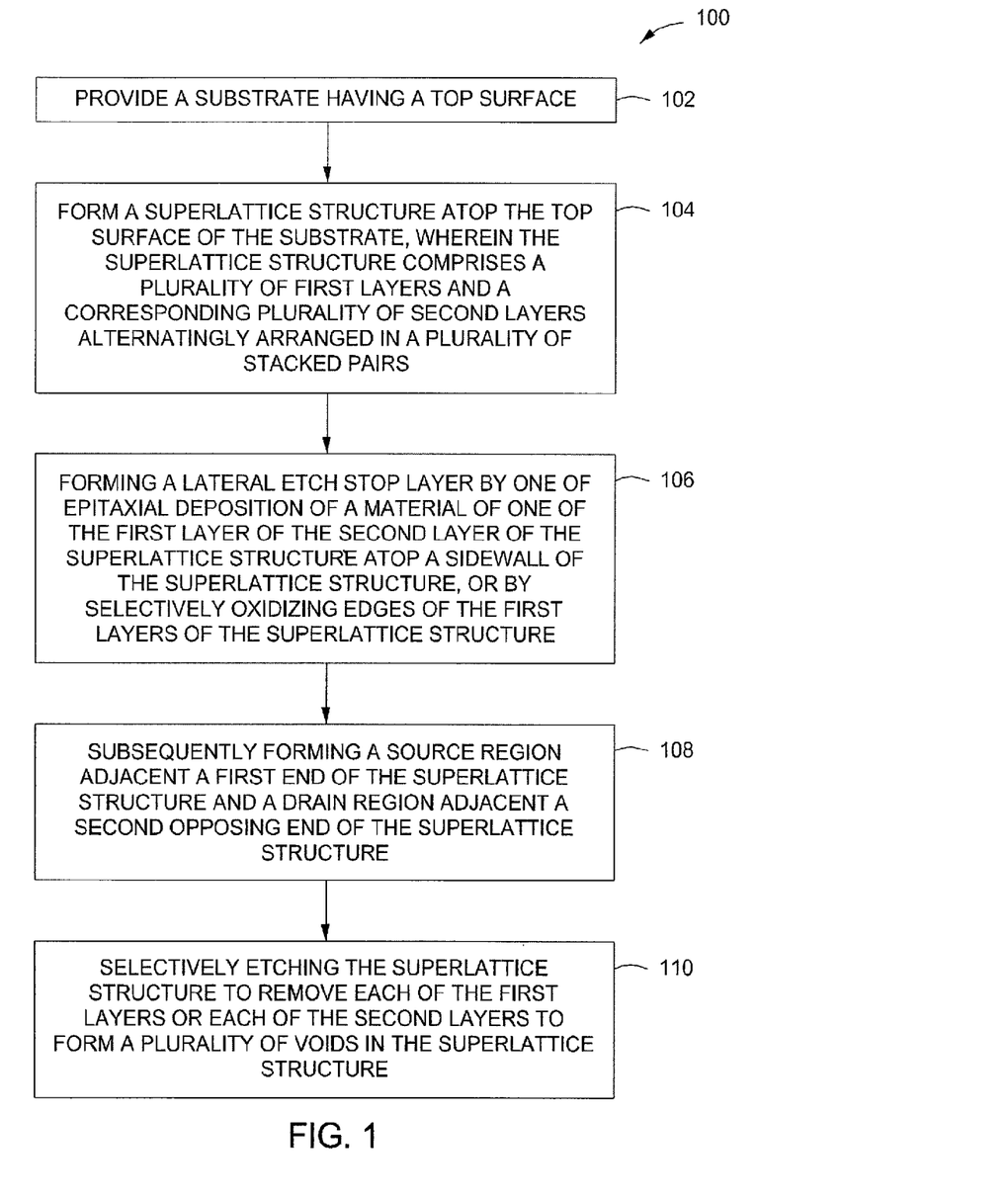
FIG. 1 depicts a flow chart of a method for forming a semiconductor device in accordance with some embodiments of the present disclosure.

FIG. 1 depicts a flow chart for a method 100 for forming a semiconductor device in accordance with some embodiments of the present disclosure. The method 100 is described below with respect to FIGS. 2A-2H, which depicts the stages of fabrications of semiconductor structures in accordance with some embodiments of the present disclosure. The inventive method 100 may be part of a multi-step fabrication process of, a semiconductor device. Accordingly, the method may be performed in any suitable process chamber coupled to a cluster tool, such as the cluster tool depicted in FIG. 3 below. The cluster tool may include process chambers for fabricating a semiconductor device, such as chambers configured for etching, deposition, physical vapor deposition (PVD), chemical vapor deposition (CVD), oxidation, or any other suitable chamber used for the fabrication of a semiconductor device.

Figure 2A:
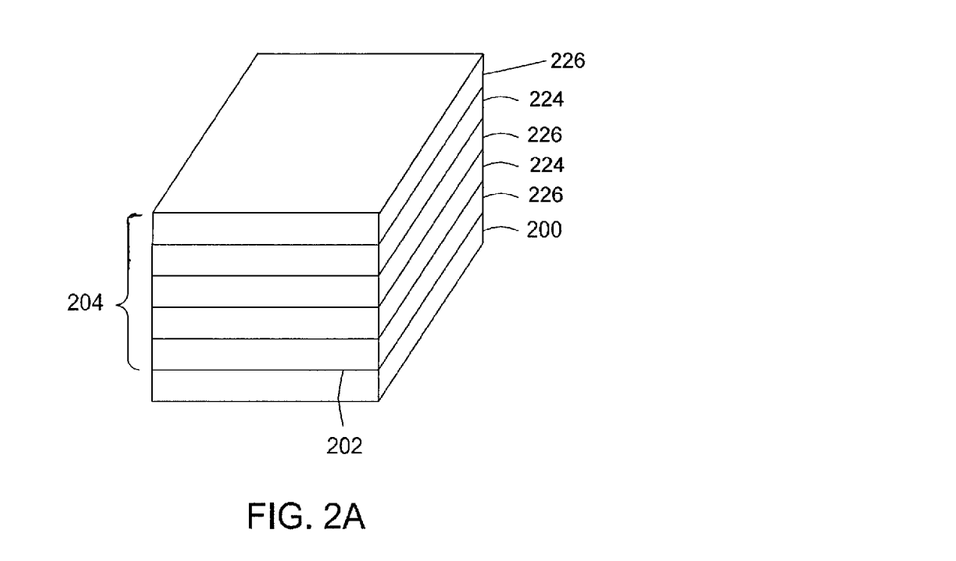
FIG. 2A-2H illustrate stages of fabrication of a substrate during a method of forming a semiconductor device in accordance with some embodiments of the present disclosure.

The method 100 begins at 102, by providing a substrate 200 having a top surface 202 (as illustrated in FIG. 2A). In some embodiments, the substrate 200 may be a bulk semiconductor substrate. The term bulk semiconductor substrate refers to a substrate in which the entirety of the substrate is comprised of a semiconductor material. The bulk semiconductor substrate may comprise any suitable semiconducting material and/or combinations of semiconducting materials for forming a semiconductor structure. For example, the semiconducting layer may comprise one or more materials such as crystalline silicon (e.g., Si<100> or Si<111>), silicon oxide, strained silicon, silicon germanium, doped or undoped polysilicon, doped or undoped silicon wafers, patterned or non-patterned wafers, doped silicon, germanium, gallium arsenide, or other suitable semiconducting materials. In some embodiments, the semiconductor material is silicon (Si). In some embodiments, the semiconductor material may be a doped material, such as n-doped silicon (n-Si), or p-doped silicon (p-Si). In some embodiments, the substrate may be doped using any suitable process such as an ion implantation process. In some embodiments, the substrate may be doped to provide a high dose of dopant at a first location of the surface of the substrate 200 in order to prevent parasitic bottom device turn on. The superlattice structure is formed atop the first location. For example, in some embodiments, the surface of the substrate may have a dopant density about $1\times10^{18}$ atoms/cm$^3$ to about $5\times10^{18}$ atoms/cm$^3$.

At 104, at least one superlattice structure 204 is formed atop the top surface 202 of the substrate 200 (as depicted in FIG. 2A). The superlattice structure 204 comprises a plurality of first layers and a corresponding plurality of second layers alternatingly arranged in a plurality of stacked pairs. In some embodiments, the plurality of first layers (e.g., dummy material layers 224) comprise at least one III-V material. In some embodiments, the corresponding plurality of second layers (e.g., semiconductor material layers 226) comprises at least one III-V material, wherein the first layers and second layers are different materials. In some embodiments, the plurality of first layers and corresponding plurality of second layers can comprise lattice matched materials with a sufficient difference in composition such that selective layer removal can subsequently be performed. In some embodiments, the plurality of first layers and a corresponding plurality of second layers may comprise Group IV materials, or Group II-VI materials. In some embodiments, the plurality of first layers and corresponding plurality of second layers may comprise silicon (Si) and silicon germanium (SiGe). In some embodiments, the plurality of first layers and corresponding plurality of second layers may comprise indium-phosphorus (InP) and indium-gallium-phosphorus (InGaP). In some embodiments, the plurality of first layers and corresponding plurality of second layers can comprise multiple pairs of lattice matched materials. For example, in some embodiments the plurality of stacked groups of layers can comprise a silicon (Si) and silicon germanium (SiGe) group and a indium-phosphorus (InP) and indium-gallium-phosphorus (InGaP) group. In some embodiments, the plurality of first layers and corresponding plurality of second layers can comprise any number of lattice matched material pairs suitable for forming a superlattice structure 204. In some embodiments, the plurality of first layers and corresponding plurality of second layers can comprise 2 to 5 pairs of lattice matched materials.

Typically, a parasitic device will exist at the bottom of the superlattice structure 204. In some embodiments, implant of a dopant in the substrate, as discussed above, may be used to suppress the turn on of the parasitic device. In some embodiments, the substrate 200 may also be etched so that the bottom portion of the superlattice structure 204 includes a substrate portion which is not removed, allowing the substrate portion to act as the bottom dummy material layer of the superlattice structure 204.

Figure 2B:
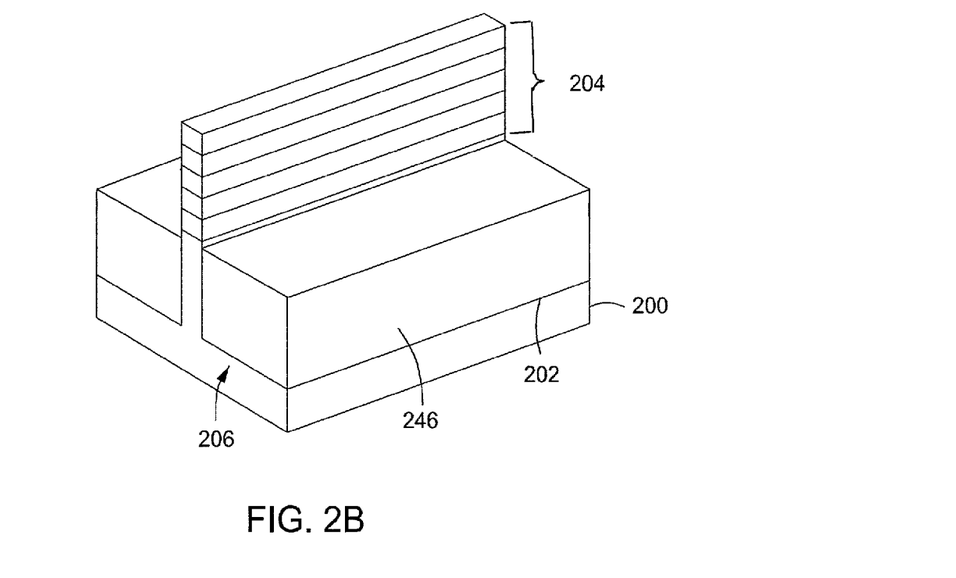

The plurality of first layers and corresponding plurality of second layers may be deposited using a conventional epitaxial chemical vapor deposition process. In some embodiments, the plurality of first layers and corresponding plurality of second layers may be deposited at a sufficiently low temperature, for example about 500 degrees Celsius to about 750 degrees Celsius, and with enough time in between depositing each layer to completely purge the chemical vapor deposition process chamber in order to prevent intermixing of the different atom species, and providing abrupt interfaces between the different atom species which advantageously provides good control of the structure after selective removal process described below. In some embodiments, the thickness of each of the layers of the superlattice structure 204 maintains a total thickness of the superlattice structure 204 below the critical thickness where dislocation defects begin to form. Furthermore, the thickness of each layer allows a margin for the loss of thickness due to selective etching and oxidation, if the superlattice structure is exposed to ambient conditions or an oxidizing process chemistry. For example, in some embodiments, the layers of the superlattice structure 204 may have a thickness of about 3 nm to about 20 nm. In some embodiments, the plurality of first layers and corresponding plurality of second layers may be patterned using conventional photolithography and etching techniques to define the superlattice structure 204 as depicted in FIG. 2B.

During patterning, the substrate 200 may also be patterned to form a plurality of field isolation regions 206 in the substrate 200 to isolate wells having different conductivity types (e.g., n-type or p-type) and/or to isolate adjacent transistors. The field isolation regions 206 are formed adjacent to the superlattice structure. As depicted in FIG. 2B, the field isolation regions 206 may be shallow trench isolation (STI) structures formed, for example, by etching a trench into the substrate 200 and then filling the trench with a suitable dielectric material 246, such as silicon oxide (oxide), silicon nitride (nitride), or the like.

In some embodiments, the dielectric material 246 is deposited on the substrate 200 and over the superlattice structure 204 using conventional chemical vapor deposition methods. In some embodiments, the dielectric material 246 is recessed below the top surface 202 of the substrate 200 so that the bottom portion of the superlattice structure 204 is formed from the substrate 200. Thus, superlattice structure 204 includes a substrate portion which acts as a bottom dummy material layer 224 of the superlattice structure 204. In some embodiments, the substrate portion is thicker than the dummy material layer 224 above in order to provide additional space between the substrate and the bottommost semiconductor material layer 226 so that a bottom, gate isolation film and a gate electrode may subsequently be formed between the substrate and the bottommost semiconductor material layer 226. Alternatively a dummy material layer 224 may be formed between the top surface 202 of the substrate 200 and the bottommost semiconductor material layer 226. In some embodiments, following the patterning, an in-situ passivation layer may be formed to prevent formation of a native oxide layer. In some embodiments, the in-situ passivation process may be an ALD deposition of a dielectric material such as silicon dioxide (SiO$_2$), silicon nitride (SiN), or aluminum oxide (AlO).

Figure 2C:
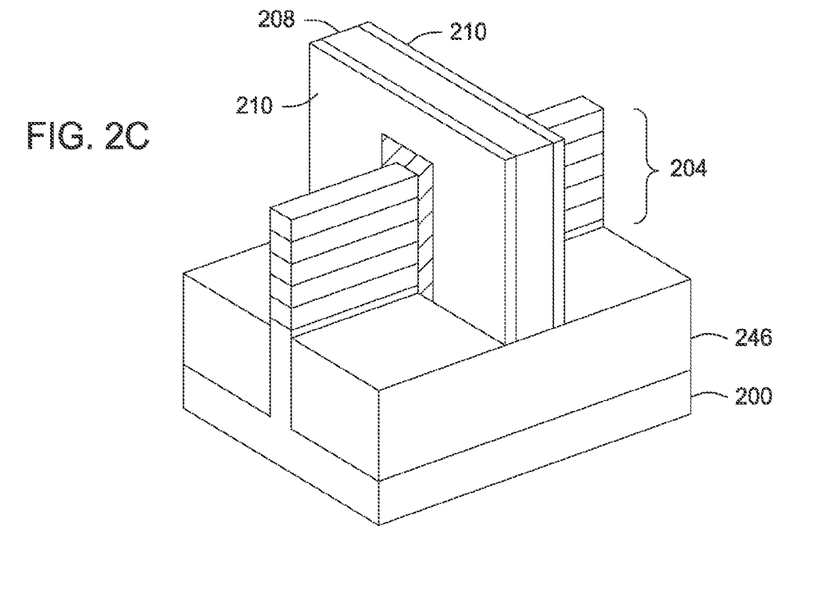

Following formation of the field isolation regions 206, a replacement gate structure (e.g., a dummy gate structure 208), as depicted in FIG. 2C, may be formed over the superlattice structure 204. The dummy gate structure 208 defines the channel region 214 of the transistor device. The dummy gate structure 208 may be formed using any suitable conventional deposition and patterning process known in the art.

As depicted in FIG. 2C, sidewall spacers 210, may be formed along outer sidewalls of the dummy gate structure 208. The sidewall spacers 210 may comprise suitable insulating materials known in the art, for example, silicon nitride, silicon oxide, silicon oxynitride, silicon carbide, or the like. The sidewall spacers 210 may be formed using any suitable conventional deposition and patterning process known in the art, such as atomic layer deposition, plasma enhanced atomic layer deposition, plasma enhanced chemical vapor deposition or low pressure chemical vapor deposition.

Figure 2D:
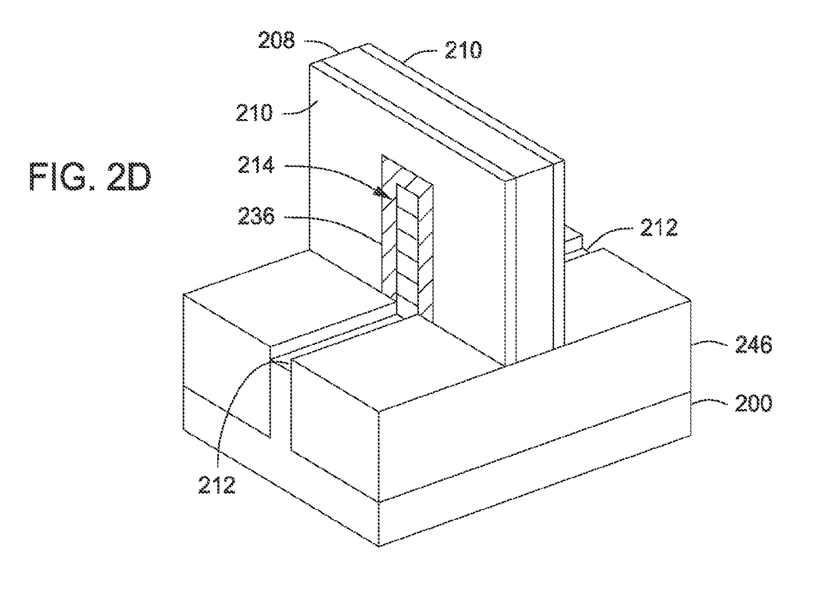

As depicted in FIG. 2D, the substrate 200 and the exposed portions of the superlattice structure 204 may be etched to form a source trench and drain trench 212 disposed on opposite sides of the superlattice structure 204. The etch process defines a channel region 214 of the transistor device. The source trench and drain trench 212 serves to contain the subsequent growth of embedded epitaxial source regions 232 and drain regions 234. In some embodiments, the substrate 200 may be etched isotropically to form the source trench and drain trench 212 vertically into the substrate 200. In some embodiments, substrate 200 may be etched at least partially horizontally, or laterally (e.g., using an anisotropic etch process), to form the source trench and drain trench 212 both vertically into the substrate 200 and extending horizontally beneath the sidewall spacers 210 and the superlattice structure 204. The horizontal etching facilitates producing source/drain recesses in the substrate 200 that extend beneath the superlattice structure 204. In some embodiments, the source trench and drain trench 212 (and optionally source/drain recesses) may have a substantially vertical sidewall and substantially flat, horizontal bottom of the source trench and drain trench 212. Alternatively, the source trench and drain trench 212 (and optionally, the source/drain recesses) may have other predetermined geometry. The source trench and drain trench 212 (and optionally source/drain recesses) may have any suitable dimensions. In some embodiments, the source trench and drain trench 212 (and optionally source/drain recesses) may be cleaned to remove etchant materials and/or annealed to repair damaged surfaces of the source trench and drain trench 212 (and optionally source/drain recesses) prior to the formation of source/drain regions as described below. The cleaning and/or annealing process may be any suitable process capable of removing etchant materials and/or repairing damaged surfaces of source/drain regions 232, 234 (and optionally source/drain recesses).

At 106, a lateral etch stop layer 236 may be formed. During the selective etch removal of the dummy material layers 224 described below, the lateral etch stop layer 236 advantageously prevents the selective etch process from extending into the source region 232 and drain region 234. In some embodiments, the lateral etch stop layer 236 may be formed by epitaxial deposition of a material of the first layer or the second layer of the superlattice structure 204, thus forming a vertical layer of material that is slower to remove in order to prevent the selective etch process from exceeding the etch boundary. The etch stop layer material is chosen for selectivity against the material to removed. The etch stop layer material is chosen to match the channel material intended to be left behind. In some embodiments, examples of etch stop layer material include silicon (Si), silicon oxide (SiO$_2$), or silicon nitride (SiN) for silicon germanium (SiGe) removal. In some embodiments, where the superlattice structure 204 comprises silicon germanium and silicon with a PMOS silicon germanium channel, a silicon germanium material may be used as a lateral etch stop layer 236 for a subsequent silicon removal. In some embodiments, where the superlattice structure 204 comprises silicon germanium and silicon with an NMOS or PMOS silicon channel, a silicon material may be used as a lateral etch stop layer 236 for a subsequent silicon germanium removal. In some embodiments, the lateral etch stop may be formed by selectively oxidizing the edges of the first layers and second layers of the superlattice structure 204 to be removed. For example, where the superlattice structure comprises silicon and silicon germanium, an oxidation process can be performed to form a thicker oxide layer on silicon germanium than on silicon (e.g. an oxide layer having a silicon germanium to silicon thickness ratio of about 3:1). The oxide layer may be cleaned from the silicon layer edges using any suitable oxide clean process known in the art and leaving oxide material on the silicon germanium material edges to serve as an lateral etch stop layer 236.

Figure 2E:
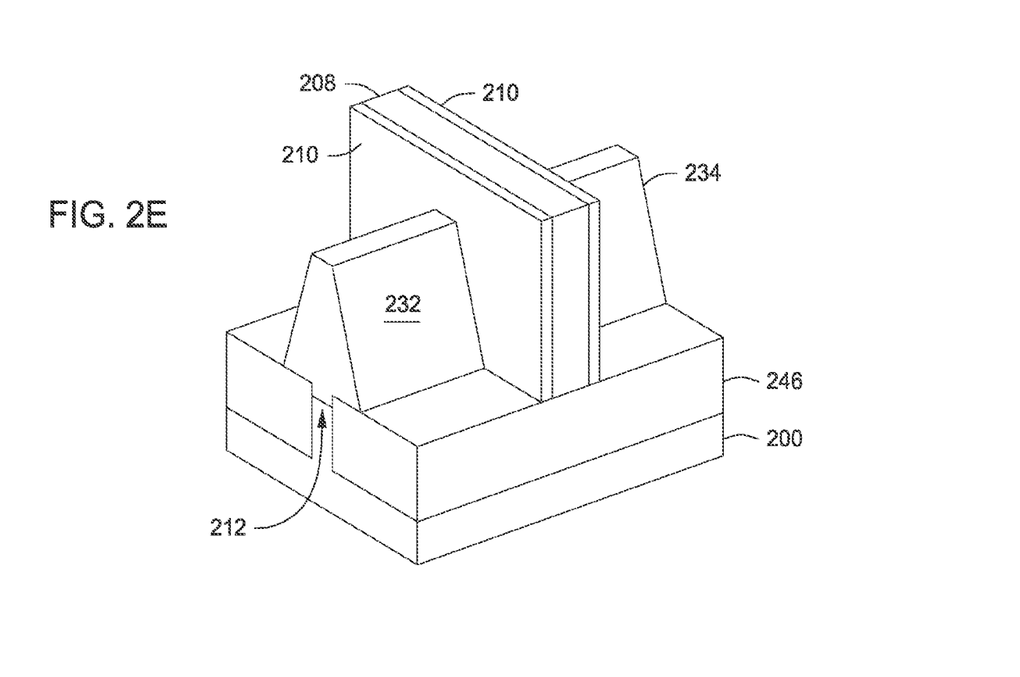

At 108, the embedded source region 232 and drain region 234 form in the source trench and drain trench 212 and the source/drain recesses as depicted in FIG. 2E. The source region 232 is formed adjacent a first end of the superlattice structure 204 and the drain region 234 is formed adjacent a second, opposing end of the superlattice structure. The source region 232 and drain region 234 may be formed from any suitable semiconductor material, such as but not limited to silicon, germanium, silicon germanium, or the like. In some embodiments, the source region 232 and drain region 234 may be formed using any suitable deposition process, such as an epitaxial deposition process.

Figure 2F:
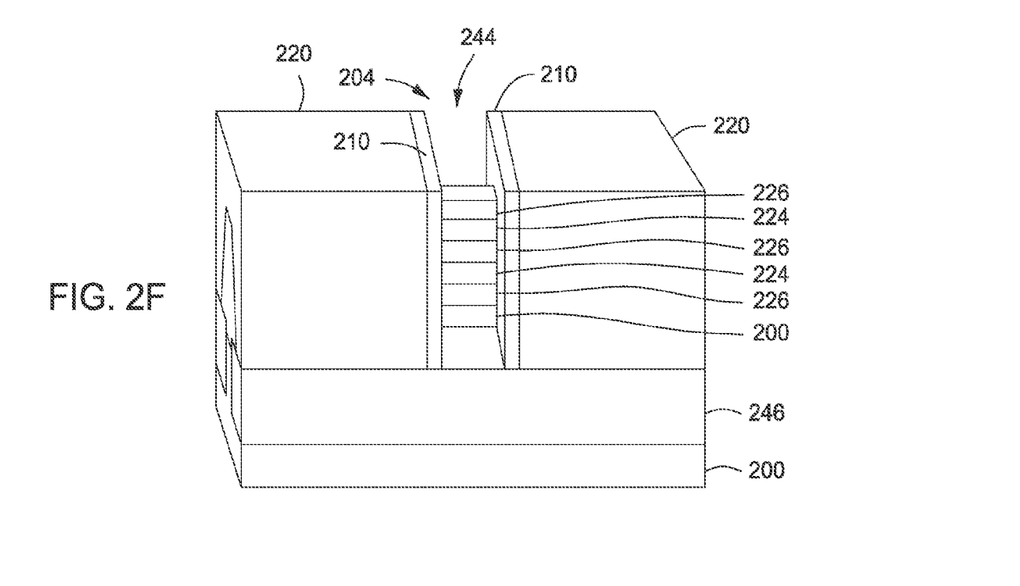

As depicted in FIG. 2F, an inter-layer dielectric (ILD) layer 220 is blanket deposited over the substrate 200, including the source/drain regions 232, 234, the dummy gate structure 208, and the sidewall spacers 210. The ILD layer 220 may be deposited using a conventional chemical vapor deposition method (e.g., plasma enhance chemical vapor deposition and low pressure chemical vapor deposition). In an embodiment, ILD layer 220 is formed from any well-known dielectric material such as, but not limited to undoped silicon oxide, doped silicon oxide (e.g., BPSG, PSG), silicon nitride, and silicon oxynitride. ILD layer 220 is then polished back using a conventional chemical mechanical planarization method to expose the top of the dummy gate structure 208 and the top of the sidewall spacers 210.

As further depicted in FIG. 2F, the dummy gate structure 208 is removed to expose the channel region 214 of the superlattice structure 204. The ILD layer 220 protects the source/drain regions 232, 234 during the removal of the dummy gate structure 208. The dummy gate structure 208 may be removed using a conventional etching method such a plasma dry etch or a wet etch.

Figure 2G:
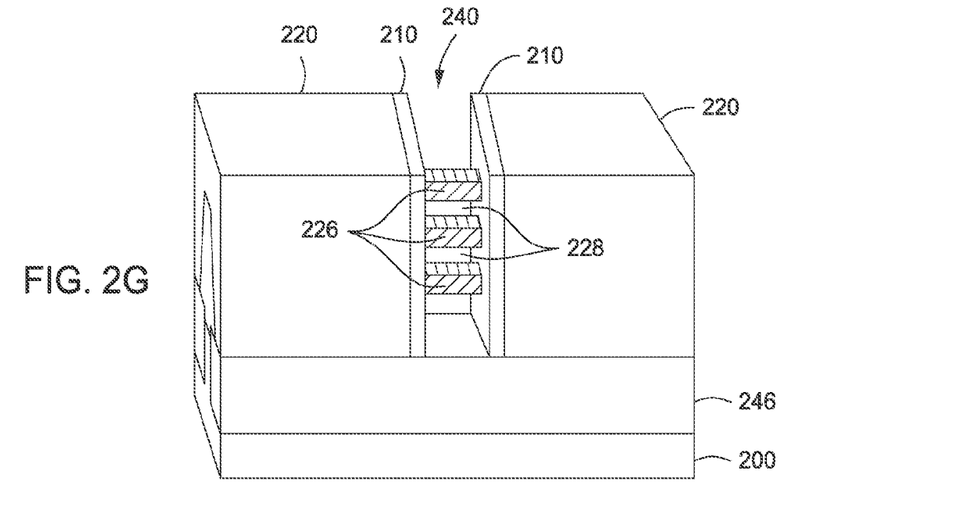

At 110, and as depicted in FIG. 2G, the dummy material layers 224 are selectively etched between the semiconductor material layers 226 in the superlattice structure 204. For example, where the superlattice structure 204 is composed of silicon layers and silicon germanium layers, the silicon germanium is selectively etched to form channel nanowires 240. The dummy material layers 224, for example silicon germanium, may be removed using any well-known etchant that is selective to the layers of the semiconductor material layers 226 where the etchant etches the layers of dummy material layers 224 at a significantly higher rate than the layers of semiconductor material layers 226. In some embodiments, a selective dry etch or wet etch process may be used. In some embodiments, where the semiconductor material layers 226 are silicon and the dummy material layers 224 are silicon germanium, the layers of silicon germanium may be selectively removed using a wet etchant such as, but not limited to aqueous carboxylic acid/nitric acid/HF solution and aqueous citric acid/nitric acid/HF solution. The removal of the dummy material layers 224 leaves voids 228 between the semiconductor material layers 226. The voids 228 between the semiconductor material layers 226 have a thickness of about 3 nm to about 20 nm. The remaining semiconductor material layers 226 form a vertical array of channel nanowires 240, depicted in FIG. 2G, that are coupled to the source/drain regions 232, 234. The channel nanowires 240 run parallel to the top surface 202 of the substrate 200 and are aligned with each other to form a single column of channel nanowires 240. The formation of the source region 232 and drain region 234 and the formation of the lateral etch stop layer 236 advantageously provide self-alignment and structural integrity in the formation of the channel structure.

Figure 2H:
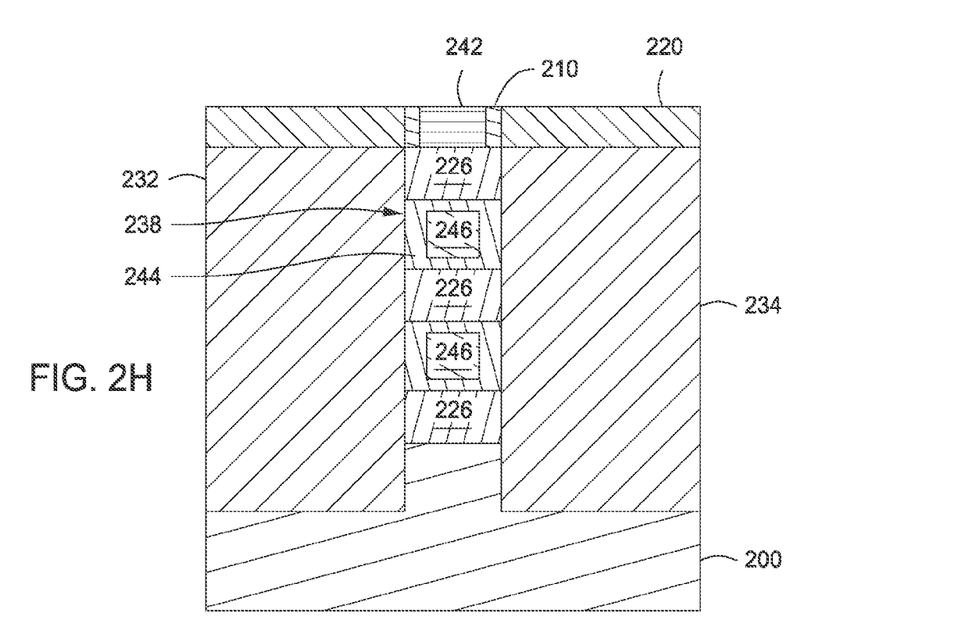

In some embodiments, following the selective etch process above, a clustered oxidation or atomic layer deposition interface layer can be used to improve the structural integrity of the device structure. The inventors have observed that very thin layers of the horizontal gate all around channel can collapse from Van Der Waals attractive forces if a wet clean is applied after the selective etch is applied. In some embodiments, as depicted in FIG. 2H, following the selective etch process above, a layer 238 is formed within each void 228 between each semiconductor material layer 226.

The layer 238 comprises an outer material 244 (disposed adjacent to each semiconductor material layer 226) and an inner material 246 (separated from each semiconductor material layer 226). In some embodiments, the outer material 244 is one or more dielectric layers such as silicon oxide, hafnium oxide, or the like. In some embodiments, the inner material 246 is a conductive material such as titanium nitride, tungsten, cobalt, aluminum, or the like. The layer 238 is formed using any suitable deposition process such as atomic layer deposition (ALD) in order to ensure the formation of a layer having a uniform thickness around each semiconductor material layer 226.

A gate electrode 242 is formed on the substrate 200 and surrounds each semiconductor material layer 226 (except where the layer 238 is present between the semiconductor material layers 226). Gate electrode 242 may be formed from any suitable gate electrode material known in the art. The gate electrode material is deposited using any suitable deposition process such as atomic layer deposition (ALD) to ensure that gate electrode 242 is formed on the layer 238 and around and between each semiconductor material layer 226. The resultant device formed using the method described herein is a horizontal gate all around device, in accordance with an embodiment of the present disclosure.

Figure 3:
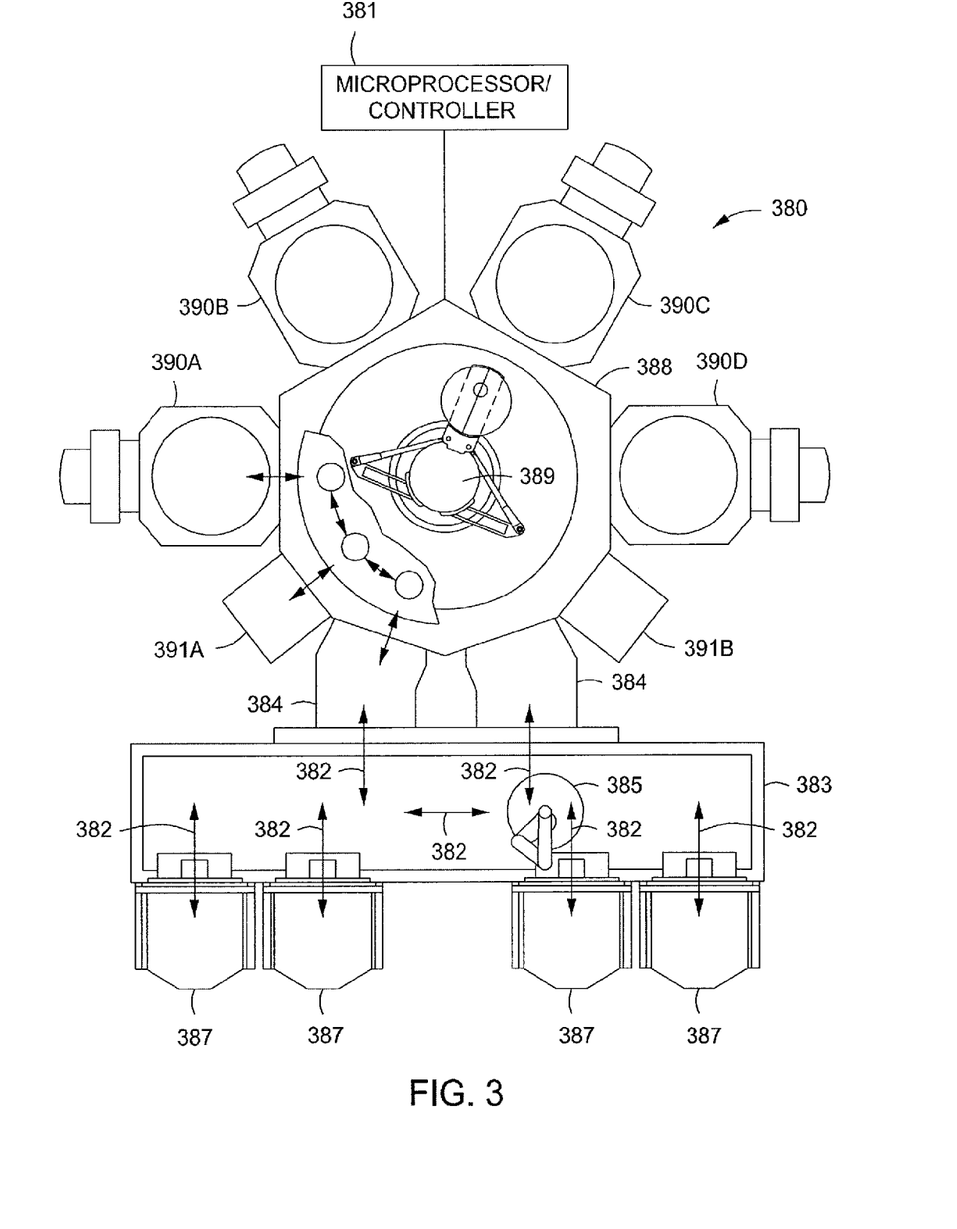
FIG. 3 illustrates a cluster tool in accordance with some embodiments of the present disclosure.

FIG. 3 depicts a cluster tool suitable for performing portions of the present disclosure. Generally, the cluster tool is a modular system comprising multiple chambers (e.g., process chambers 390A-D, service chambers 391A-B, or the like) which perform various functions including substrate center-finding and orientation, degassing, annealing, deposition and/or etching. According to embodiments of the present disclosure, the cluster tool may include at least a semiconductor substrate process chamber configured to perform at least portions of the inventive methods 100 and may further include chambers such as ion implantation chambers, etch chambers, and the like. The multiple chambers of the cluster tool are mounted to a central vacuum transfer chamber which houses a robot adapted to shuttle substrates between the chambers. The vacuum transfer chamber is typically maintained at a vacuum condition and provides an intermediate stage for shuttling substrates from one chamber to another and/or to a load lock chamber positioned at a front end of the cluster tool.

By way of illustration, a particular cluster tool 380 is shown in a plan view in FIG. 3. The cluster tool 380 generally comprises a plurality of chambers and robots and is equipped with a microprocessor controller 381 programmed to carry out the various processing methods performed in the cluster tool 380. A front-end environment 383 is shown positioned in selective communication with a pair of load lock chambers (load locks 384). A pod loader 385 disposed in the front-end environment 383 is capable of linear and rotational movement (arrows 382) to shuttle cassettes of substrates between the load locks 384 and a plurality of pods 387 which are mounted on the front-end environment 383. The load locks 384 provide a first vacuum interface between the front-end environment 383 and a transfer chamber 388 (e.g., a vacuum transfer chamber). Two load locks 384 are provided to increase throughput by alternatively communicating with the transfer chamber 388 and the front-end environment 383. Thus, while one load lock 384 communicates with the transfer chamber 388, a second load lock 384 communicates with the front-end environment 383. A robot 389 is centrally disposed in the transfer chamber 388 to transfer substrates from the load locks 384 to the various processing chambers 390A-D and service chambers 391A-B. The processing chambers 390A-D may perform various processes such as physical vapor deposition, chemical vapor deposition, etching, cleaning, and the like, while the service chambers 391 may be adapted for degassing, orientation, cool down, and the like.

For the purposes of practicing embodiments of the present disclosure, at least one of the processing chambers (for example, 390A) of the cluster tool 380 may be configured to perform an etch process to form a shallow trench isolation (STI) recess and a second processing chamber (for example 390B) may be configured to perform an atomic layer deposition process. A cluster tool having the recited configuration may advantageously prevent silicon germanium or III-V material oxidation after STI recess. In some embodiments, at least one of the processing chambers (for example, 390A) of the cluster tool 380 may be configured to perform an etch process, a second processing chamber (for example 390B) may be configured to perform a cleaning process and a third processing chamber (for example 390C) may be configured to perform a epitaxial deposition process. A cluster tool having the recited configuration may advantageously prevent unwanted oxidation after the source/drain recess is etched and reduces or eliminates subsequent cleaning of oxidized surfaces prior to epitaxial deposition. In some embodiments, at least one of the processing chambers (for example, 390A) of the cluster tool 380 may be configured to perform a selective etch process, and a second processing chamber (for example 390B) may be configured to perform one of a deposition process, for example deposition of an interlayer dielectric, or an oxidation process. A cluster tool having the recited configuration may advantageously prevent oxidation of the channel structure upon exposure of the gate all around channel.

While the foregoing is directed to embodiments of the present disclosure, other and further embodiments of the disclosure may be devised without departing from the basic scope thereof.

The invention claimed is:

1. A method of forming a semiconductor device, comprising:
   implanting a dopant into a first location on a substrate;
   forming a superlattice structure atop a top surface of the substrate, wherein the superlattice structure comprises a plurality of first layers and a corresponding plurality of second layers alternatingly arranged in a plurality of stacked pairs, and wherein the superlattice structure is formed atop the first location;
   forming a lateral etch stop layer by epitaxial deposition of a material of the first layer or the second layer of the superlattice structure atop a sidewall of the superlattice structure, or by selectively oxidizing edges of the first layers and second layers of the superlattice structure;
   subsequently forming a source region adjacent a first end of the superlattice structure and a drain region adjacent a second opposing end of the superlattice structure; and
   selectively etching the superlattice structure to remove each of the first layers or each of the second layers to form a plurality of voids in the superlattice structure.

2. The method of claim 1, wherein the first layers comprise at least one III-V material and the second layers comprise at least one III-V material, wherein the first layers and second layers are different materials.

3. The method of claim 1, further comprising patterning the substrate to form a plurality of field isolation regions in the substrate adjacent to the superlattice structure.

4. The method of claim 3, further comprising filling the field isolation regions with a dielectric material.

5. The method of claim 4, further comprising forming a replacement gate structure over the superlattice structure.

6. The method of claim 5, further comprising forming a sidewall spacer along outer sidewalls of the replacement gate structure.

7. The method of claim 6, wherein forming the source region and the drain region comprises etching the substrate and an exposed portion of the superlattice structure to form a source trench and a drain trench disposed on opposite sides of the superlattice structure, wherein the source trench contains the source region and the drain trench contains the drain region.

8. The method of claim 7, further comprising etching the source trench and the drain trench horizontally beneath the superlattice structure and the sidewall spacer.

9. The method of claim 8, further comprising depositing an inter-layer dielectric layer over the substrate.

10. The method of claim 9, further comprising, etching the replacement gate structure to expose a channel region of the superlattice structure prior to selectively etching the superlattice structure.

11. The method of claim 10, further comprising forming a layer to fill the plurality of voids in the superlattice structure, wherein the layer comprises an outer material and an inner material and wherein the outer material is a dielectric material and the inner material is a conductive material.

12. The method of claim 1, wherein a thickness of the first layers and the second layers are each about 3 nm to about 20 nm.

13. A method of forming a semiconductor device, comprising:
    implanting a dopant into a first location on a substrate;
    forming a superlattice structure atop a top surface of the substrate, wherein the superlattice structure comprises a plurality of first layers and a corresponding plurality of second layers alternatingly arranged in a plurality of stacked pairs, and wherein the superlattice structure is formed atop the first location;
    patterning the substrate to form a plurality of field isolation regions in the substrate adjacent to the superlattice structure;
    filling the field isolation regions with a dielectric material;
    forming a replacement gate structure over the superlattice structure;
    forming a sidewall spacer along outer sidewalls of the replacement gate structure;
    forming a lateral etch stop layer by epitaxial deposition of a material of the first layer or the second layer of the superlattice structure atop a sidewall of the superlattice structure, or by selectively oxidizing edges of the first layers and second layers of the superlattice structure;
    subsequently forming a source region adjacent a first end of the superlattice structure and a drain region adjacent a second opposing end of the superlattice structure;
    depositing an inter-layer dielectric layer over the substrate;
    etching the replacement gate structure to expose a channel region of the superlattice structure prior to selectively etching the superlattice structure;
    selectively etching the superlattice structure to remove each of the first layers or each of the second layers to form a plurality of voids in the superlattice structure; and
    depositing a layer to fill the plurality of voids in the superlattice structure, wherein the layer comprises an outer material and an inner material and wherein the outer material is a dielectric material and the inner material is a conductive material.

14. The method of claim 13, wherein the first layers comprise at least one III-V material and the second layers comprise at least one III-V material, wherein the first layers and second layers are different materials.

15. The method of claim 13, wherein a thickness of the first layers and the second layers are each about 3 nm to about 20 nm.

16. The method of claim 13, wherein forming the source region and the drain region comprises etching the substrate and an exposed portion of the superlattice structure to form a source trench and a drain trench disposed on opposite sides of the superlattice structure, wherein the source trench contains the source region and the drain trench contains the drain region.

17. The method of claim 16, further comprising etching the source trench and the drain trench horizontally beneath the superlattice structure and the sidewall spacer.

18. The method of claim 13, wherein the top surface of the substrate has a dopant density of about $1 \times 10^{18}$ atoms/cm$^3$ to about $5 \times 10^{18}$ atoms/cm$^3$.

19. A computer readable medium, having instructions stored thereon which, when executed, cause a method of forming a semiconductor device, the method comprising:
- implanting a dopant into a first location on a substrate;
- forming a superlattice structure atop a top surface of the substrate, wherein the superlattice structure comprises a plurality of first layers and a corresponding plurality of second layers alternatingly arranged in a plurality of stacked pairs, and wherein the superlattice structure is formed atop the first location;
- forming a lateral etch stop layer by epitaxial deposition of a material of the first layer or the second layer of the superlattice structure atop a sidewall of the superlattice structure, or by selectively oxidizing edges of the first layers and second layers of the superlattice structure;
- subsequently forming a source region adjacent a first end of the superlattice structure and a drain region adjacent a second opposing end of the superlattice structure; and
- selectively etching the superlattice structure to remove each of the first layers or each of the second layers to form a plurality of voids in the superlattice structure.

* * * * *